(12) United States Patent
Higashi et al.

(10) Patent No.: US 8,108,993 B2
(45) Date of Patent: Feb. 7, 2012

(54) METHOD OF MANUFACTURING WIRING SUBSTRATE, AND METHOD OF MANUFACTURING SEMICONDUCTOR DEVICE

(75) Inventors: Mitsutoshi Higashi, Nagano (JP); Kei Murayama, Nagano (JP); Masahiro Sunohara, Nagano (JP); Hideaki Sakaguchi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 327 days.

(21) Appl. No.: 12/403,456

(22) Filed: Mar. 13, 2009

(65) Prior Publication Data
US 2009/0236024 A1 Sep. 24, 2009

(30) Foreign Application Priority Data
Mar. 24, 2008 (JP) ................................ P2008-076823

(51) Int. Cl.
*H05K 3/30* (2006.01)
(52) U.S. Cl. ................ 29/832; 29/530; 29/830; 29/831; 174/260; 174/262

(58) Field of Classification Search .................... 29/530, 29/825, 831, 527.1, 527.2, 829, 830, 841, 29/842, 852, 832; 361/778; 439/45, 47, 439/75; 427/58; 174/261, 262
See application file for complete search history.

(56) References Cited

FOREIGN PATENT DOCUMENTS
JP     2000-323613     11/2000

*Primary Examiner* — A. Dexter Tugbang
*Assistant Examiner* — Jeffrey T Carley
(74) *Attorney, Agent, or Firm* — Drinker Biddle & Reath LLP (57) ABSTRACT

A method of manufacturing a wiring substrate is disclosed. The method includes: (a) preparing a supporting substrate including a main body and a through electrode penetrating the main body, wherein the supporting substrate includes a first surface and a second surface opposite to the first surface, and a trace is formed on the second surface of the supporting substrate; (b) forming a build-up wiring structure by alternately forming a wiring layer and an insulating layer on the first surface of the supporting substrate; and (c) obtaining a wiring substrate by separating the build-up wiring structure from the supporting substrate. Step (b) includes: forming the wiring layer using the through electrode as a power feeding wiring, and step (c) includes: peeling the build-up wiring structure from the supporting substrate to obtain the wiring substrate.

8 Claims, 6 Drawing Sheets

FIG. 6D

METHOD OF MANUFACTURING WIRING SUBSTRATE, AND METHOD OF MANUFACTURING SEMICONDUCTOR DEVICE

This application claims priority from Japanese Patent Application No. 2008-076823, filed on Mar. 24, 2008, the entire contents of which are hereby incorporated by reference.

BACKGROUND OF THE INVENTION

1. Technical Field

The present disclosure relates to a method of manufacturing a wiring substrate manufactured using a supporting substrate, and a method of manufacturing a semiconductor device.

2. Related Art

According to a related art method of manufacturing a build-up wiring substrate on which a semiconductor chip is mounted, the build-up wiring structure is formed by forming insulating layers and wiring layers on a supporting substrate as a metal plate made of copper (Cu) or the like, and then separating the insulating layers and the wiring layers from the supporting substrate (see JP-A-2000-323613, for example).

In the related art method, the supporting substrate as the metal plate made of copper (Cu) or the like is selectively removed from the build-up wiring structure after forming the build-up wiring structure. Concretely, the supporting substrate is etched by a wet etching using an iron (III) chloride aqueous solution, a copper (II) chloride aqueous solution, an ammonium persulfate solution, or the like.

However, it takes much time to remove the supporting substrate as the metal plate made of copper (Cu) by the etching. Also, the supporting substrate cannot be reused because the supporting substrate is dissolved by the etching. Therefore, a huge number of supporting substrates are needed for mass-production of the build-up wiring substrate.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a method of manufacturing a wiring substrate and a method of manufacturing a semiconductor device, capable of achieving reduction in a manufacturing cost and improvement of a manufacturing efficiency by reusing a supporting substrate.

According to one or more aspects of the present invention, a method of manufacturing a wiring substrate is provided. The method includes: (a) preparing a supporting substrate including a main body and a through electrode penetrating the main body, wherein the supporting substrate includes a first surface and a second surface opposite to the first surface, and a trace is formed on the second surface of the supporting substrate; (b) forming a build-up wiring structure by alternately forming a wiring layer and an insulating layer on the first surface of the supporting substrate; and (c) obtaining a wiring substrate by separating the build-up wiring structure from the supporting substrate. Step (b) includes: forming the wiring layer using the through electrode as a power feeding wiring, and step (c) includes: peeling the build-up wiring structure from the supporting substrate to obtain the wiring substrate.

According to one or more aspects of the present invention, a method of manufacturing a semiconductor device is provided. The method includes: (a) manufacturing the wiring substrate using the method according to claim 1; and (b) mounting a semiconductor chip on the wiring substrate.

Other aspects and advantages of the present invention will be apparent from the following description, the drawings, and the claims.

DETAILED DESCRIPTION OF EXEMPLARY EMBODIMENTS OF THE INVENTION

Exemplary embodiments of the present invention will be now described with the drawings hereinafter.

FIGS. 1A to 1F are sectional views to explain a method of manufacturing a supporting substrate used in a first exemplary embodiment of the present invention. Also, FIGS. 2A to 2G are views to explain a method of manufacturing a wiring substrate according to the first exemplary embodiment of the present invention.

In a method of manufacturing the wiring substrate according to the present embodiment, the wiring substrate is manufactured by forming wiring layers and insulating layers on this supporting substrate shown in FIGS. 1A to 1F. For convenience of explanation, the method of manufacturing the supporting substrate will be described with reference to FIGS. 1A to 1F, and then a manufacturing method of the wiring substrate will be described with reference to FIGS. 2A to 2G.

Figure 1A:
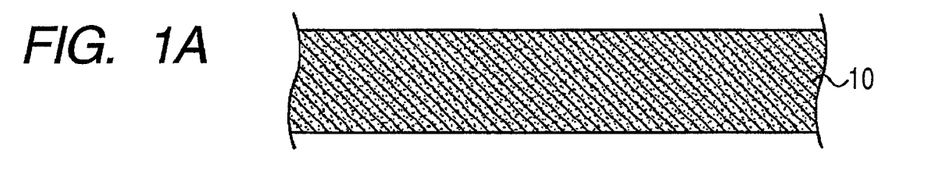
FIGS. 1A to 1F are sectional views to explain a method of manufacturing a supporting substrate used in a first exemplary embodiment of the present invention.

In order to manufacture the supporting substrate in FIGS. 1A to 1F, as shown in FIG. 1A, firstly, a silicon substrate 10 as a silicon wafer is prepared.

Figure 1B:
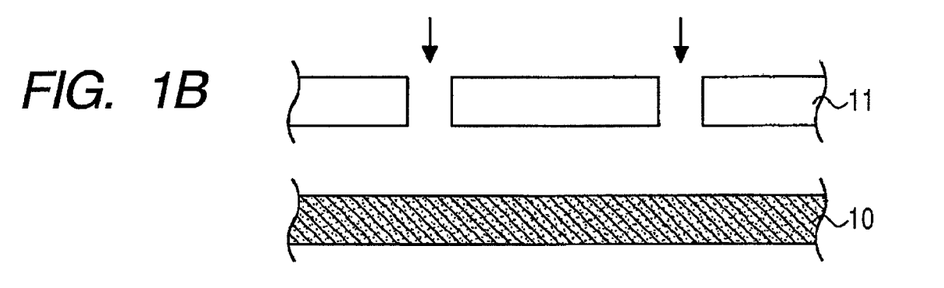

Then, as shown in FIG. 1B, a surface of the silicon wafer is ground by back grinder (BG), for example. Thus, the silicon substrate 10 is thinned to a thickness of about 200 μm, preferably. A thickness of the silicon substrate 10 at this time is set to have mechanical strength that enables the substrate to act as a reinforcing plate in manufacturing the wiring substrate, as described later.

Then, as also shown in FIG. 1B, a mask 11 having opening portions is arranged on the silicon substrate 10. Then, the silicon substrate 10 is etched through the opening portions by Reactive Ion Etching (RIE).

Figure 1C:
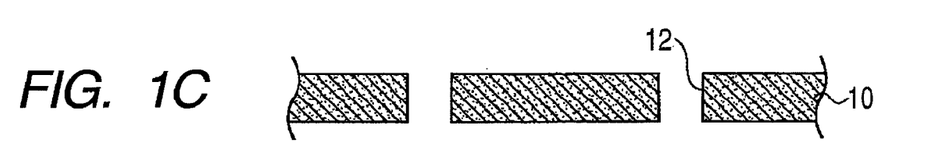

Thus, as shown in FIG. 1C, a plurality of through holes 12 that pass through the silicon substrate 10 vertically are formed. The through holes 12 are formed to provide through electrodes therein, but there is no necessity that the through holes 12 should always be formed to pass through the silicon substrate 10 vertically. FIG. 1C shows a state that the mask 11 is removed after the through holes 12 are formed.

Also, it is advantageous that the through holes 12 should be formed such that shapes of holes passing through a surface of the silicon substrate 10 are not inclined and top portions thereof are positioned in the horizontal direction, which ensures that pads provided on the through electrodes are evenly formed. In this case, a diameter of the through holes 12 may be set to about 50 to about 70 μm, for example. Then, the mask 11 is removed.

Figure 1D:
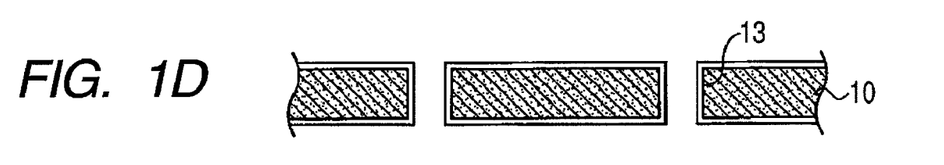

Then, as shown in FIG. 1D, the silicon substrate 10 is thermally oxidized. Thus, an insulating layer 13 as a silicon oxide layer is formed on the whole surface of the silicon substrate 10 and inner surfaces of the through holes 12.

Then, a catalytic treatment is applied to the whole surface of the silicon substrate 10 and the inner surfaces of the through holes 12, and then a seed layer is formed by electroless plating. Then, a resist film is formed on the silicon substrate 10 on which the seed layer is formed, and also opening portions corresponding to the through holes 12 and forming positions of wiring layers 32-1 are formed in the resist film.

Figure 1E:
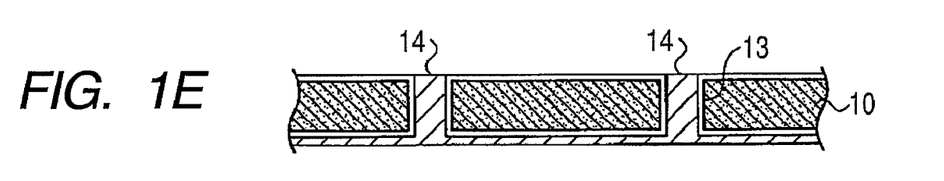

Then, as shown in FIG. 1E, Cu electroplating is applied while using the seed layer as a power feeding layer. Thus, a Cu plating layer 14 is deposited on the inner portions of the through holes 12 and on portions of the silicon substrate 10 where the wiring layers 32-1 are formed. Then, the resist film is removed, and the unnecessary seed layer is removed by etching.

Figure 1F:
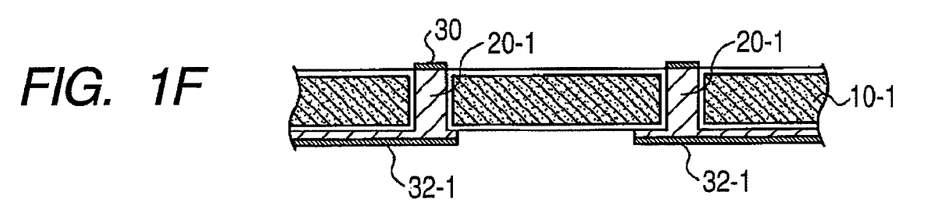

Then, as shown in FIG. 1F, the nickel (Ni) and gold (Au) plating is applied to the Cu plating layer 14 in the through holes 12, and each pad 30 are formed on the respective Cu plating layers 14. Accordingly, through electrodes 20-1 each having the pad 30 on the Cu plating layer 14 in the through holes 12 are formed. In this case, each of the pads 30 is arranged to correspond to an arrangement of a semiconductor chip 120. For example, a pitch between the adjacent pads 30 may be set to about 110 to about 180 μm.

Also, the nickel (Ni) and gold (Au) plating is applied to the Cu plating layer 14 on a lower surface of the silicon substrate 10. Thus, the wiring layers 32-1 are formed. The wiring layers 32-1 are leading wirings (rewirings) that are connected to the through electrodes 20-1 formed in the silicon substrate 10. The wiring layers 32-1 are used as power feeding wirings that are used to form wiring layers of a build-up wiring structure on the silicon substrate 10, as described later.

Thus, a silicon substrate 10-1 as the supporting substrate is manufactured.

In the above embodiment, although the case where silicon is used as a material of the supporting substrate is described, the material of the supporting substrate is not limited thereto. For example, other inorganic materials such as a glass substrate, other organic materials such as a resin can be used. In such case, it is advantageous that a thermal expansion coefficient should be set to about 1 ppm/° C. to about 10 ppm/° C.

Next, a method of manufacturing a wiring substrate will be described with reference to FIGS. 2A to 2G hereunder.

Figure 2A:
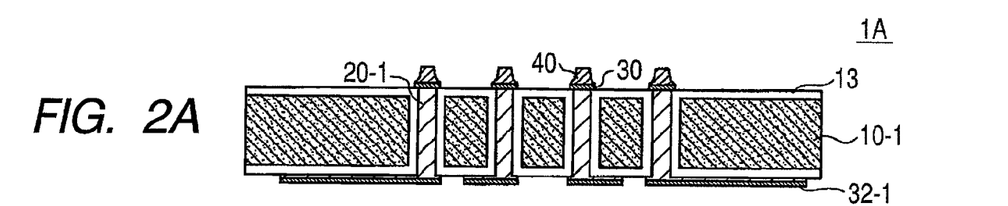
FIGS. 2A to 2G are views to explain a method of manufacturing a wiring substrate according to the first exemplary embodiment of the present invention.

Firstly, as shown in FIG. 2A, the silicon substrate 10-1 as the supporting substrate is prepared. Then, each of electrodes 40 made of a low-melting metal such as indium (In), for example, is formed on the respective one of the pads 30 of the silicon substrate 10-1. The respective electrodes 40 are formed to have a protruded shape that protrudes from the silicon substrate 10-1.

In order to form the electrodes 40, a resist film is formed on an upper surface of the silicon substrate 10-1 by utilizing a dry film, for example. Then, opening portions are formed in the resist film to expose the pads 30 formed on the silicon substrate 10-1 by applying the patterning process to the resist film. In this case, the opening portions may be formed previously in the dry film-like resist film, and then the resist film having opening portions may be provided on the silicon substrate 10-1.

Then, each of the electrodes 40 are formed on the pads 30 by electroplating or the electroless plating respectively. Each electrode 40 is not limited to indium. But it is advantageous that the electrode 40 should be formed of the low-melting metal that is melted and peeled in the process described later. Also, the electrode 40 can be formed using the material such as a conductive metal, or the like, which has the property that is easily peelable when an energy such as heat, light, for example, is supplied. The electrodes 40 have a function of separating wiring layers of the build-up wiring structure formed on the silicon substrate 10-1 from the pads 30 on the silicon substrate 10-1.

Figure 2B:
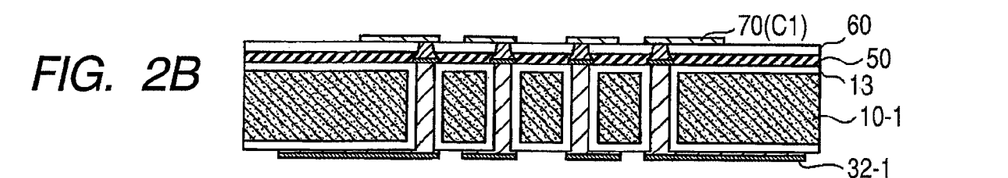

Then, as shown in FIG. 2B, a peeling layer 50 for covering the electrodes 40 is formed on an upper surface of the silicon substrate 10-1. The peeling layer 50 is pasted onto an insulating film such as a resin (described later), which is formed on the silicon substrate 10-1 and the peeling layer 50. As the peeling layer 50, a thermosetting adhesive sheet is used that has the property that is easily peelable from both the silicon substrate 10-1 and the insulating film such as the resin when a heat is supplied. In this case, organic material, thermal foam material, inorganic material such as an oxide film, for example, may be used as the peeling layer 50.

Then, the build-up wiring structure is formed on the peeling layer 50 formed on the silicon substrate 10-1. First, a first insulating layer 60 constituting the build-up wiring structure is formed on the peeling layer 50 of the silicon substrate 10-1. As a material of the first insulating layer 60, a resin material such as an epoxy resin, a polyimide resin, or the like may be used.

As an example of forming method of the first insulating layer 60, a resin film is laminated on the peeling layer 50 formed on an upper surface of the silicon substrate 10-1, and then the resin film is cured by applying a heat treatment at a temperature of about 130 to about 150° C. while pressing the film. Thus, the first insulating layer 60 is obtained.

After the first insulating layer 60 is formed on the peeling layer 50, each hole is formed to correspond to forming positions of the electrodes 40 in the laminated layers 50 and 60, by laser beam machining. Accordingly, through holes from which the electrodes 40 are exposed are formed in the peeling layer 50 and the first insulating layer 60.

Then, first wiring layers 70 each serving as the build-up wiring structure and connected to the electrode 40 are formed on the silicon substrate 10-1. The first wiring layer 70 may be formed of copper (Cu), for example. In order to form the first wiring layers 70, an electroless plating (e.g., Cu) layer is formed on the first insulating layer 60, and then a resist film having opening portions corresponding to the first wiring layers 70 is formed.

Then, Cu is deposited in the opening portions in the resist by electroplating while a power is fed through the through electrodes 20-1 formed in the silicon substrate 10-1. Then, the electroless plating (e.g., Cu) layer is exposed by removing the resist film and is removed by the etching. Thus, the first wiring layers 70 are formed. The first wiring layer 70 serves as a first connection terminal C1.

Figure 2C:
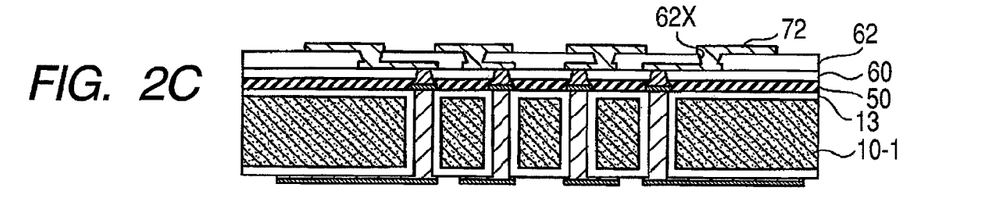

Then, as shown in FIG. 2C, the steps similar to above steps are repeatedly performed. Thus, a second insulating layer 62 covering the first wiring layers 70 is formed on the silicon substrate 10-1, and then first via holes 62X are formed in portions of the second insulating layer 62 on the first wiring layers 70. Also, second wiring layers 72 each connected to the first wiring layer 70 via the first via hole 62X are formed on the second insulating layer 62 of the silicon substrate 10-1.

As the method of forming the wiring layers 70, 72, various wiring forming methods such as a subtractive process can be used in addition to the semi-additive process. Also, as a material of the first wiring layer 70, gold (Au), alloys such as Ti/Pt (titanium/platinum), or the like can be used in addition to copper (Cu).

Figure 2D:
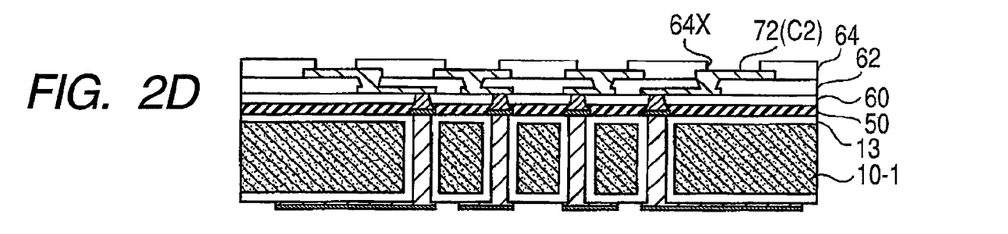

Then, as shown in FIG. 2D, a solder resist film 64 having opening portions 64X is formed on the second wiring layers 72 of a build-up wiring structure 90-1 formed on the silicon substrate 10-1. Accordingly, the second wiring layer 72 exposed from the opening portion 64X in the solder resist film 64 serves as a second connection terminal C2.

Figure 2E:
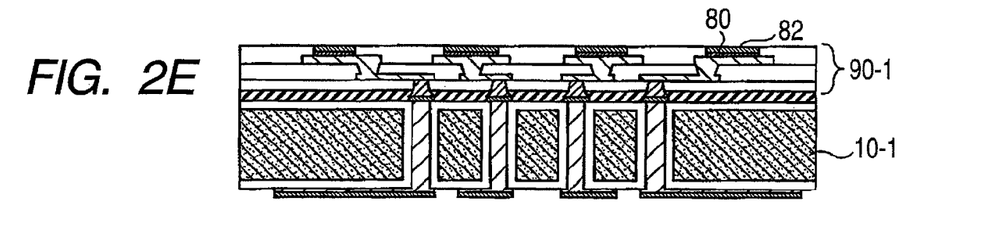

Then, as shown in FIG. 2E, metal films such as a nickel (Ni) film 80, a gold (Au) film 82 and the like are formed on the second wiring layers 72 of the silicon substrate 10-1 by plating respectively.

In this manner, the build-up wiring structure 90-1 is formed on the first wiring layers 70 (the first connection terminals C1) of the silicon substrate 10-1.

In the above exemplary embodiment, the two-layered build-up wiring layer (the first wiring layer 70, the second wiring layer 72) is formed. But an n-layered (n is an integer of 1 or more) build-up wiring layer may be formed.

Figure 2F:
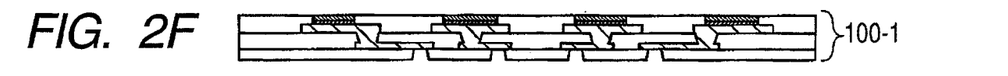

Then, as shown in FIG. 2F, the build-up wiring structure 90-1 is peeled from the silicon substrate 10-1. A heat treatment is applied to peel the build-up wiring structure 90-1 from the silicon substrate 10-1.

As described above, when indium (In), for example, is used as the electrode 40, this electrode 40 is fused by heating at about 170° C. that exceeds 156° C. as a melting point of indium. Accordingly, the electrodes 40 formed on the silicon substrate 10-1 are fused, and thus the pads 30 and the first wiring layers 70 both connected through the electrode 40 can be separated from each other. Also, the peeling layer 50 made of a thermosetting resin is thermally cured by heating, so that the adhesive property of the peeling layer 50 is lowered. As a result, the silicon substrate 10-1 and the first insulating layer 60 of the build-up wiring structure 90 both adhered through the peeling layer 50 can be easily separated from each other.

Therefore, a wiring substrate 100-1 can be formed by separating the build-up wiring structure 90-1 from the silicon substrate 10-1. Because the silicon substrate 10-1 serving as the supporting substrate is formed of silicon, a flatness of the formed wiring substrate 100-1 is high. Thus, the wiring substrate 100-1 formed on the silicon substrate 10-1 having a high flatness can also be the wiring substrate whose positional accuracy is very high.

Figure 2G:
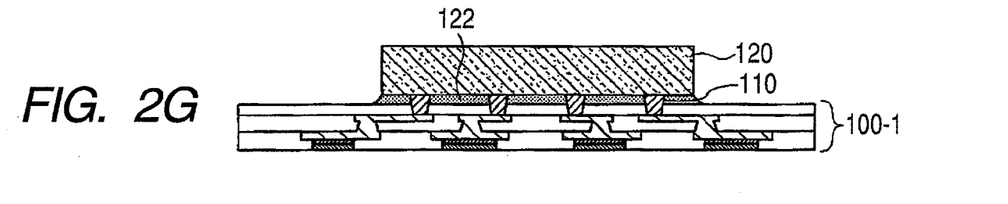

Then, as shown in FIG. 2G, bumps 110 of the semiconductor chip 120 are flip-chip connected to the first wiring layers 70 of the wiring substrate 100-1. Also, an underfill resin 122 may be filled into a gap under the semiconductor chip 120. When the semiconductor chip 120 is mounted on the wiring substrate 100-1 in this manner, a semiconductor device 1A can be obtained.

Contrary to the related art method, according to the above method, the silicon substrate 10-1 which is peeled from the build-up wiring structure 90-1 is not removed by etching. Therefore, in manufacturing the build-up wiring structure, the build-up wiring structure 90-1 can be formed again by reusing the same silicon substrate 10-1. In this fashion, the silicon substrate 10-1 can be reused as the supporting substrate many times. Thus, a manufacturing efficiency can be improved, so that the build-up wiring substrate can be manufactured inexpensively.

Also, according to the above method, the through electrodes 20-1 are provided in the silicon substrate 10-1. Therefore, an electric power needed for the wiring layers of the build-up wiring structure 90-1 can be fed through the wiring layers 32-1 provided on the back surface of the silicon substrate 10-1. Also, the power feeding wirings are put together as the wiring layers 32-1 formed on the back surface of the silicon substrate 10-1. Therefore, there is no need to provide the power feeding wirings on the front surface of the silicon substrate 10-1. As a result, a necessity for power feeding wiring layouts that become more complicated along with a higher density of the wiring substrate formed on the supporting substrate can be eliminated, and thus the formation of the power feeding wirings can be simplified.

Also, the semiconductor device 1A formed by the above method is mounted with the wiring substrate 100-1 that is formed on the silicon substrate 10-1 as the supporting substrate. Because the semiconductor chip 120 and the silicon substrate 10-1 are formed of the same material, there is no difference in thermal expansion coefficient between them. Thus, a thermal stress can be suppressed, which is caused due to a difference in thermal expansion coefficient in mounting the semiconductor chip 120 on the wiring substrate 100-1 formed using the silicon substrate 10-1, so that a warp, a distortion or the like are hard to occur.

Figure 3A:
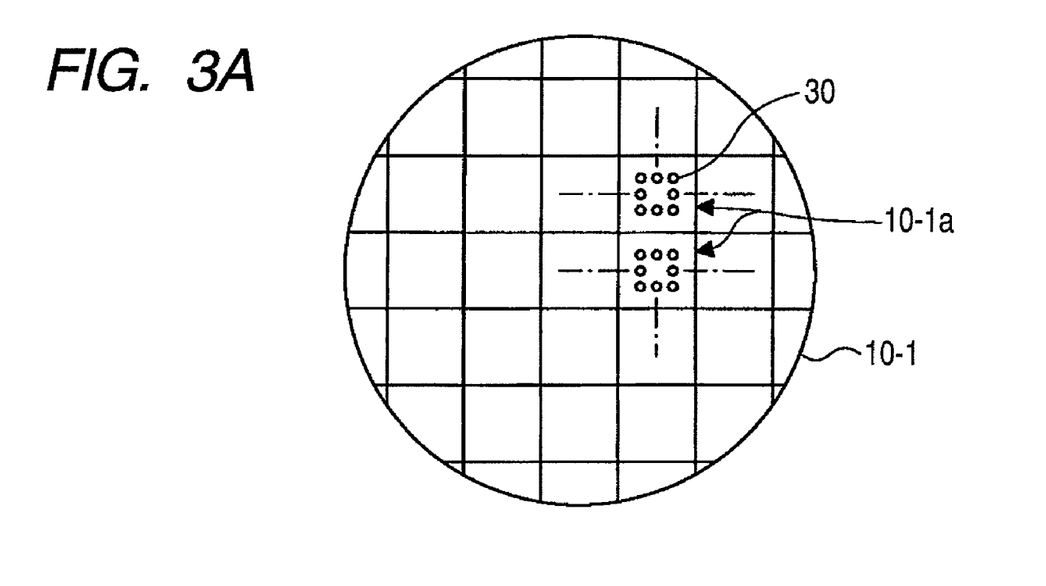
FIGS. 3A and 3B are views of a silicon substrate when viewed from the top.
Figure 3B:
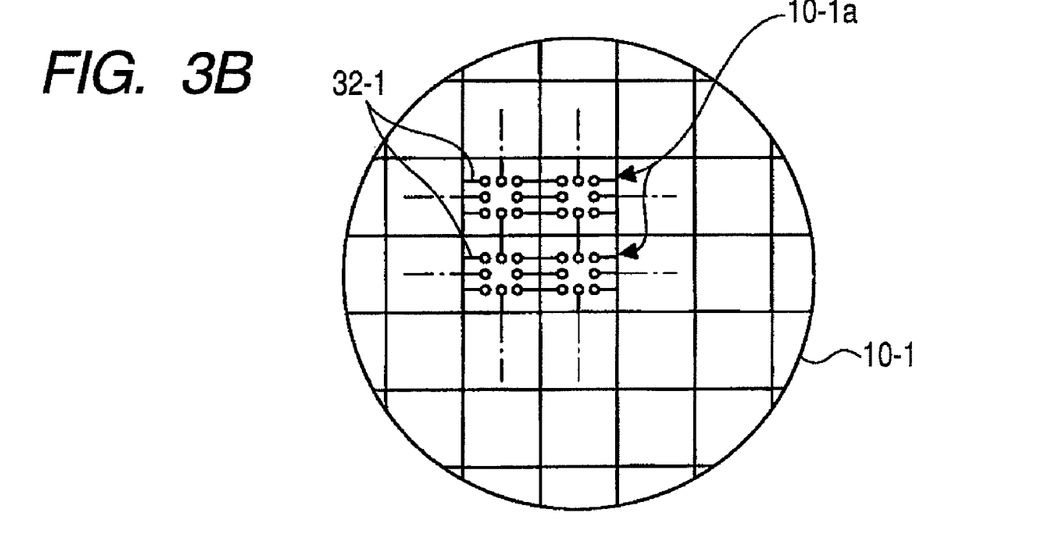

FIGS. 3A and 3B are views of the silicon substrate 10-1 when viewed from the top. FIG. 3A shows a surface of the silicon substrate 10-1 on which the build-up wiring structure 90-1 is formed. The silicon substrate 10-1 is partitioned into a plurality of areas 10-1a, and the pads 30 are exposed from a surface of each area 10-1a. The area 10-1a corresponds to an outer shape of the wiring substrate on which one semiconductor chip 120 is mounted. A layout of the pads 30 in the area 10-1a is decided depending on the design of the semiconductor chip 120. When the wiring substrate formed in this area 10-1a is diced into individual pieces, the wiring substrate (package) on which the semiconductor chip 120 is mounted is completed.

Also, FIG. 3B shows a surface of the silicon substrate 10-1 on which the wiring layers 32-1 are formed. The wiring layers 32-1 connected to the through electrodes 20-1 of the silicon substrate 10-1 are formed on the back surface of the silicon substrate 10-1. As shown in FIG. 3B, the wiring layers 32-1 are formed as a power feeding pattern that is common to individual areas 10-1a, and respective power feeding patterns are coupled mutually. As described above, the power feeding wirings needed for the wiring layers of the build-up wiring structure 90-1 are formed intensively on the back surface of the silicon substrate 10-1. Thus, the silicon substrate 10-1 does not need the complicated wiring design to feed a power, and thus simplification of the power feeding wirings can be achieved.

Next, a method of manufacturing a wiring substrate according to a second exemplary embodiment of the present invention will be described hereinafter. FIGS. 4A to 4D are views to explain the method of manufacturing the wiring substrate according to the second exemplary embodiment.

According to the second exemplary embodiment, a convex area is provided on the silicon substrate 10-1 as the supporting substrate used in the first exemplary embodiment and the wiring substrate is formed on the silicon substrate having the convex area.

Figure 4A:
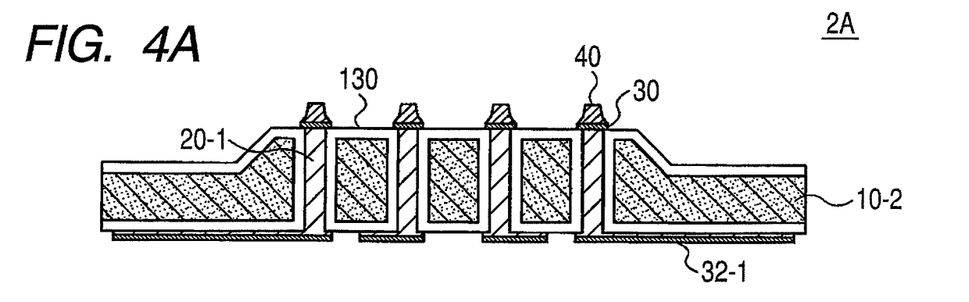
FIGS. 4A to 4D are views to explain a method of manufacturing a wiring substrate according to a second exemplary embodiment of the present invention.

As shown in FIG. 4A, a silicon substrate 10-2 has a convex area 130 serving as an area in which the semiconductor chip 120 is mounted. The convex area 130 has a plurality of through electrodes 20-1. In order to form the convex area 130 on the silicon substrate 10-2, the silicon substrate 10 as the silicon wafer is prepared, and then the convex area 130 is formed by applying dry etching to the silicon substrate 10.

Then, as also shown in FIG. 4A, according to the methods similar to those already described in the first exemplary embodiment, the through electrodes 20-1 are provided in the convex area 130 of the silicon substrate 10-2, the pad 30 is formed on the top ends of the through electrodes 20-1 of the silicon substrate 10-2 respectively, and the wiring layers 32-1 are formed on a lower surface of the silicon substrate 10-2.

In this manner, as shown in FIG. 4A, the silicon substrate 10-2 having the convex area 130 is formed as the supporting substrate.

Then, as also shown in FIG. 4A, the electrode 40 is made of low-melting metal such as indium (In), for example, and is formed on each of the pads 30 using the method similar to that in the first exemplary embodiment. The electrode 40 can be formed using the material such as the conductive metal, or the like, which has the property that is easily peelable when an energy such as heat or light is supplied.

Figure 4B:
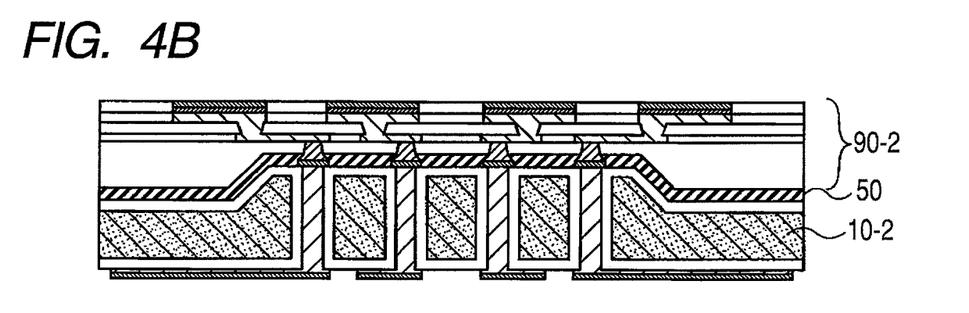

Then, as shown in FIG. 4B, a peeling layer 50 is formed on the silicon substrate 10-2 by the method similar to that in the first exemplary embodiment while using the silicon substrate 10-2 as the supporting substrate, and then a build-up wiring structure 90-2 is formed on the peeling layer.

Figure 4C:
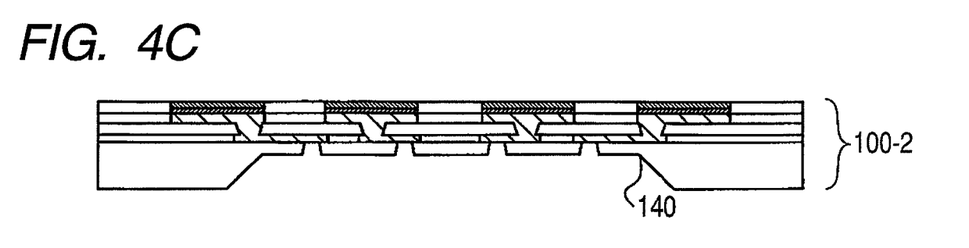

Then, as shown in FIG. 4C, the build-up wiring structure 90-2 is peeled from the silicon substrate 10-2 by using the method similar to that in the first exemplary embodiment. Thus, a wiring substrate 100-2 is formed. As shown in FIG. 4C, a concave area 140 in which the semiconductor chip 120 is mounted is formed of a resin layer in the wiring substrate 100-2. The concave area 140 is a cavity structure of the wiring substrate 100-2.

Figure 4D:
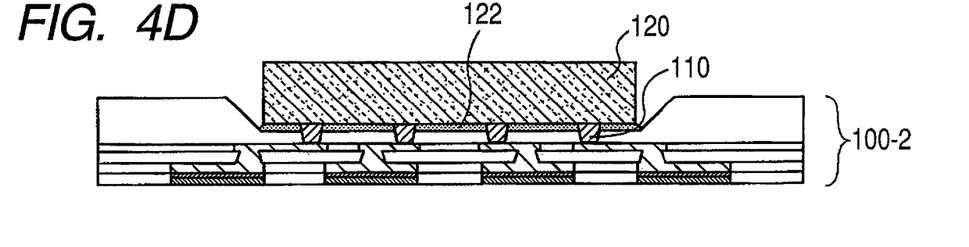

Then, as shown in FIG. 4D, the bumps 110 of the semiconductor chip 120 are flip-chip connected to the wiring substrate 100-2 by using the method similar to that in the first exemplary embodiment. Also, the underfill resin 122 can be filled into a gap under the semiconductor chip 120. In this manner, the semiconductor chip 120 is mounted on the wiring substrate 100-2, and thus a semiconductor device 2A is completed.

The wiring substrate 100-2 formed by the above method has the cavity structure as the concave area 140. Therefore, the semiconductor chip 120 mounted on the wiring substrate 100-2 is disposed in the concave area 140 formed on the wiring substrate 100-2. Therefore, when a plurality of semiconductor chips 120 are mounted in the concave area 140 of the wiring substrate 100-2, alignment of these semiconductor chips can be easily performed.

Next, a method of manufacturing a wiring substrate according to a third exemplary embodiment of the present invention will be described hereinafter. FIGS. 5A to 5D are views to explain the method of manufacturing the wiring substrate according to the third exemplary embodiment.

In the third exemplary embodiment, the through electrodes are formed even in a flat area of the silicon substrate 10-2 as the supporting substrate used in the second exemplary embodiment.

Figure 5A:
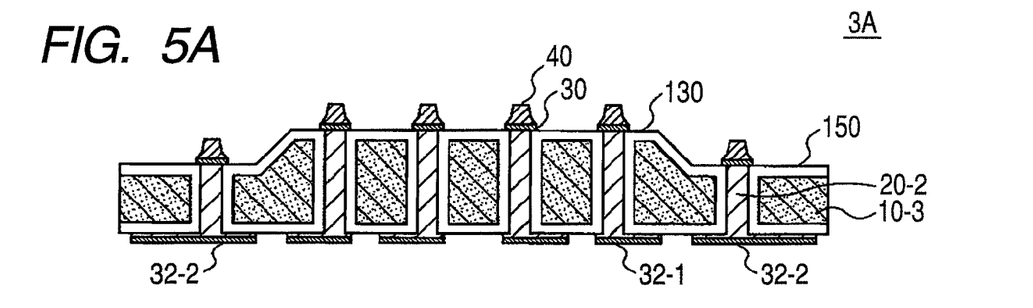
FIGS. 5A to 5D are views to explain a method of manufacturing a wiring substrate according to a third exemplary embodiment of the present invention.

As shown in FIG. 5A, a silicon substrate 10-3 has through electrodes 20-2 in a flat area 150. The flat area 150 corresponds to an outer peripheral portion of the position in which the semiconductor chip 120 is mounted. The through electrodes 20-2 formed in the flat area 150 are provided to form a reinforcing layer (stiffener) described later. As the method of forming the through electrodes 20-2 in the flat area 150, the method similar to the method of forming the above through electrodes 20-1 is employed.

Then, as also shown in FIG. 5A, according to the method similar to the above, the through electrodes 20-2 are provided in the flat area 150 of the silicon substrate 10-3, the pad 30 is formed on the top ends of the through electrodes 20-2 on an upper surface of the silicon substrate 10-3 respectively, and wiring layers 32-2 are formed on a lower surface of the silicon substrate 10-3.

In this manner, the silicon substrate 10-3 as the supporting substrate has the through electrodes 20-2 in the flat area 150 of the silicon substrate 10-3 shown in FIG. 5A and the wiring layers 32-2 on the lower surface of the silicon substrate 10-3.

Then, as also shown in FIG. 5A, the electrode 40 is made of a low-melting metal such as indium (In), for example, and is formed on each of the pads 30 on the top ends of the through electrodes 20-2, which are formed in the flat area 150 of the silicon substrate 10-3, by using the method similar to the above. Similarly to the above, the electrode 40 can be formed using the material such as a conductive metal, or the like, which has the property that is easily peelable when an energy such as heat or light is supplied.

Figure 5B:
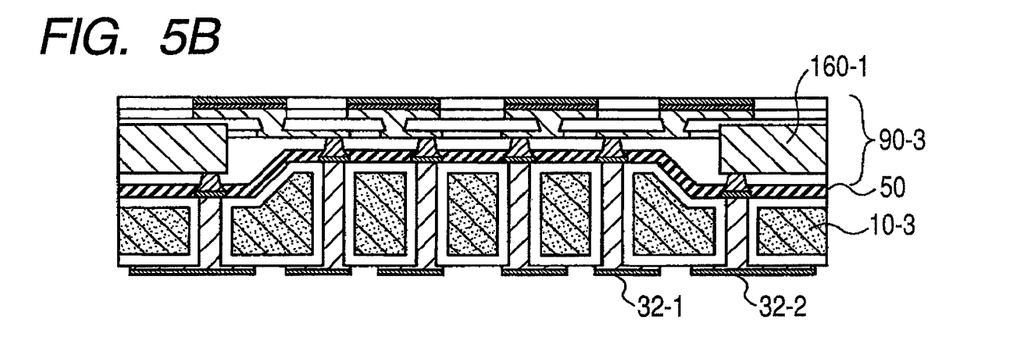

Then, as shown in FIG. 5B, the peeling layer 50 is formed on the silicon substrate 10-3 using the method similar to the above while using the silicon substrate 10-3 as the supporting substrate. Also, a reinforcing layer 160-1 is formed using the through electrodes 20-2 to feed a power, while forming a build-up wiring structure 90-3 by the method similar to the above. The reinforcing layer 160-1 is formed by Cu electroplating while using the through electrodes 20-2 to feed a power. Also, the reinforcing layer 160-1 is formed on the outer peripheral portion of the position in which the semiconductor chip 120 is mounted to constitute a frame shape when viewed from the top. The reinforcing layer 160-1 has a function of correcting/reinforcing a warp and a waviness of the wiring substrate that is obtained by separating the build-up wiring structure from the silicon substrate 10-3, as described later.

Figure 5C:
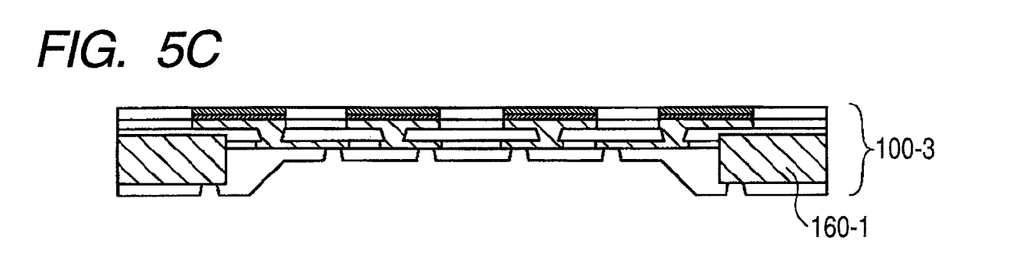

Then, as shown in FIG. 5C, the build-up wiring structure 90-3 is peeled from the silicon substrate 10-3 by using the method similar to the above. In this way, a wiring substrate 100-3 is formed.

Figure 5D:
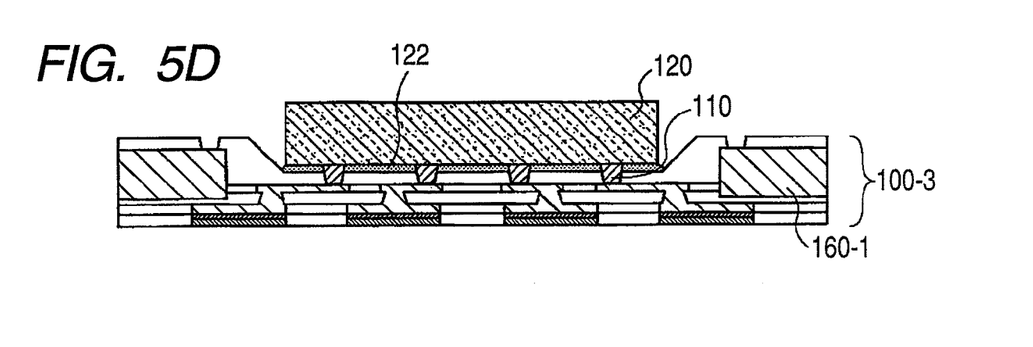

Then, as shown in FIG. 5D, the bumps 110 of the semiconductor chip 120 are flip-chip connected to the wiring substrate 100-3 by using the method similar to the above. Also, the underfill resin 122 can be filled into a gap under the semiconductor chip 120. In this manner, the semiconductor chip is mounted on the wiring substrate 100-3, and thus a semiconductor device 3A is completed.

The wiring substrate 100-3 formed by the above method has the reinforcing layer 160-1 in a portion of the wiring substrate 100-3, which is the outer peripheral portion of the mounting portion of the semiconductor chip 120. Therefore, a warp and a waviness of the wiring substrate 100-3 itself are corrected, and thus the wiring substrate 100-3 is flatten. As a result, reliability of the mounting of the semiconductor chip 120 can be further improved.

Next, a method of manufacturing a wiring substrate according to a fourth exemplary embodiment of the present invention will be described hereinafter. FIGS. 6A to 6D are views to explain the method of manufacturing the wiring substrate according to the fourth exemplary embodiment.

In the fourth exemplary embodiment, a metal frame is provided in advance on the silicon substrate 10-1 as the supporting substrate used in the first exemplary embodiment and then the wiring substrate is formed in the metal frame.

Figure 6A:
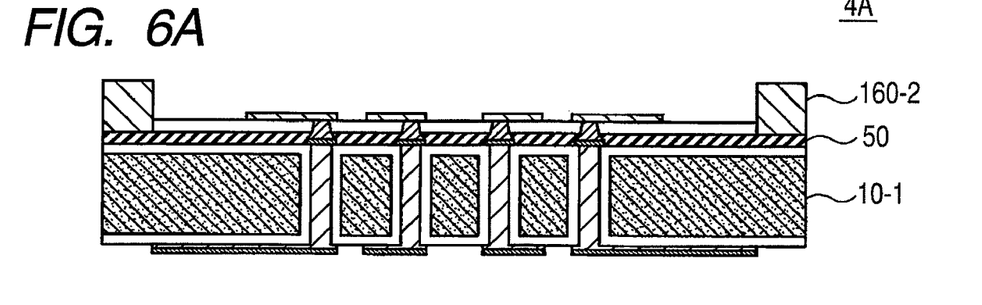
FIGS. 6A to 6D are views to explain a method of manufacturing a wiring substrate according to a fourth exemplary embodiment of the present invention.

As shown in FIG. 6A, the silicon substrate 10-1 used in the first exemplary embodiment is prepared. The electrode 40 is formed on each of the pads 30 of the silicon substrate 10-1 by using the method similar to the above, and then the peeling layer 50 is formed. Then, a reinforcing layer 160-2 is formed of a metal frame made of copper (Cu), iron (Fe), stainless iron or the like, and is provided around the electrodes 40 formed on the pads 30 on the silicon substrate 10-1 by plating method. Also, a ceramic frame formed in advance, for example, can be provided as the reinforcing layer 160-2.

Figure 6B:
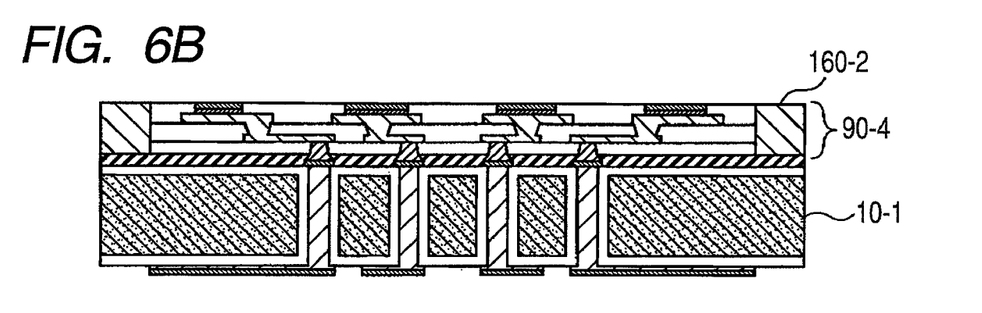

Then, as shown in FIG. 6B, a build-up wiring structure 90-4 is formed on the inside of the reinforcing layer 160-2 on the silicon substrate 10-1 by using the method similar to the above. The reinforcing layer 160-2 is formed on the outer peripheral portion of the position on which the semiconductor chip is mounted, to constitute the frame shape when viewed from the top. The reinforcing layer 160-2 has a function of correcting/reinforcing a warp and a waviness of the wiring substrate that is obtained by separating the build-up wiring structure 90-4 from the silicon substrate 10-1, as described later.

Figure 6C:
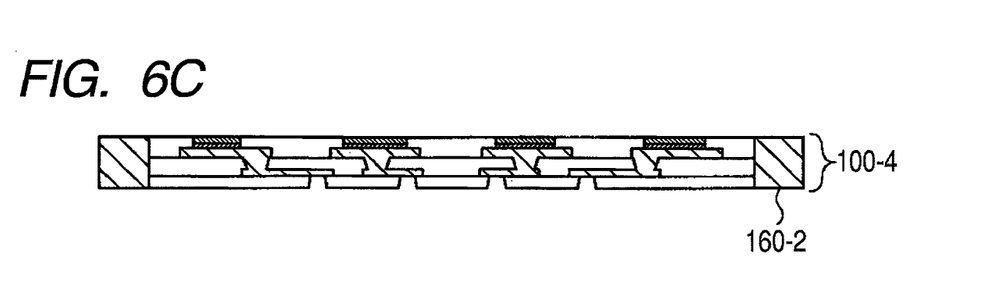

Then, as shown in FIG. 6C, the build-up wiring structure 90-4 is peeled from the silicon substrate 10-1 by using the method similar to the above. In this manner, a wiring substrate 100-4 is formed.

Figure 6D:
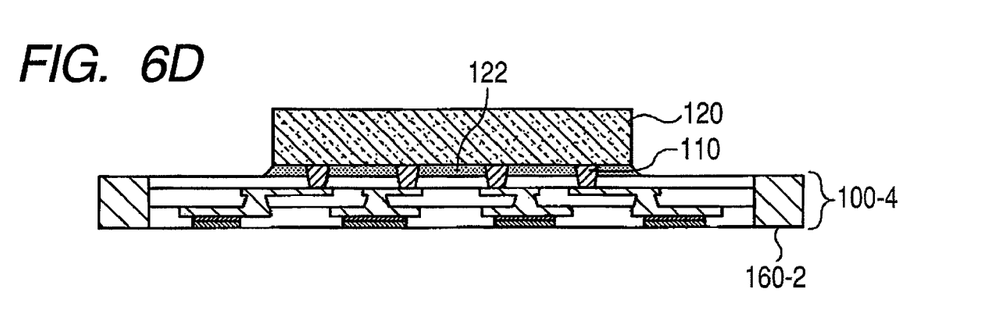

Then, as shown in FIG. 6D, the bumps 110 of the semiconductor chip 120 are flip-chip connected to the wiring substrate 100-4 by using the method similar to the above. Also, the underfill resin 122 can be filled into a gap under the semiconductor chip 120. In this manner, the semiconductor chip 120 is mounted on the wiring substrate 100-4, and thus a semiconductor device 4A can be completed.

Since the wiring substrate 100-4 manufactured by the above method has the reinforcing layer 160-2 in the outer peripheral portion of the wiring substrate 100-4, a warp and a waviness of the wiring substrate 100-4 itself are corrected, and thus the wiring substrate 100-4 is made flat. Therefore, reliability of the mounting of the semiconductor chip 120 can be further improved.

As described above, according to the exemplary embodiment, the supporting substrate used for manufacturing the build-up wiring substrate is not removed by etching, and therefore the supporting substrate can be reused many times. Also, the supporting substrate has the through electrodes, and therefore the through electrodes can be used as the power feeding wiring in forming the wirings of the build-up wiring structure. Also, the power feeding wirings connected to the through electrodes are put together on the back surface of the silicon substrate. Therefore, complicated layout for the wirings on the front surface of the silicon substrate can be eliminated. Accordingly, it is possible to provide the wiring substrate manufacturing method and the semiconductor device manufacturing method, capable of achieving a reduction in a manufacturing cost and an improvement of a manufacturing efficiency by reusing the supporting substrate many times.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A method of manufacturing a wiring substrate, the method comprising:
    (a) preparing a supporting substrate comprising a main body and a through electrode penetrating the main body, wherein the supporting substrate comprises a first surface and a second surface opposite to the first surface, and a trace is formed on the second surface of the supporting substrate;
    (b) forming a protruded electrode on the first surface of the supporting substrate such that a forming position of the protruded electrode corresponds to a forming position of the through electrode;
    (c) forming a peeling promotion layer on the first surface of the supporting substrate such that a tip end of the protruded electrode is exposed from the peeling promotion layer;
    (d) forming a build-up wiring structure by alternately forming a wiring layer and an insulating layer on the first surface of the supporting substrate; and
    (e) obtaining a wiring substrate by separating the build-up wiring structure from the supporting substrate,
    wherein step (d) comprises:
    forming the wiring layer such that the wiring layer is electrically connected to the tip end of the protruded electrode, using the through electrode as a power feeding wiring,
    and wherein step (e) comprises:
    separating the peeling promotion layer and the protruded electrode from the build-up wiring structure to separate the build-up wiring structure from the supporting substrate.

2. The method according to claim 1, wherein the main body is formed of organic material or inorganic material.

3. The method according to claim 1, wherein a thermal expansion coefficient of the supporting substrate is in a range of about 1 ppm/° C. to about 10 ppm/° C.

4. The method according to claim 1, wherein the supporting substrate comprises a concave portion or a convex portion on the first surface, and
    the concave portion or the convex portion is used to form a mounting region, on which a semiconductor chip is to be mounted, in the wiring substrate.

5. The method according to claim 1, further comprising:
    (f) forming a reinforcing layer for reinforcing the wiring substrate on the first surface of the supporting substrate at the same time as step (d).

6. The method according to claim 1,
    wherein step (e) comprises: fusing the protruded electrode to separate the protruded electrode from the build-up wiring structure.

7. The method according to claim 6, wherein the protruded electrode is made of indium.

8. A method of manufacturing a semiconductor device, the method comprising:
    (a) manufacturing the wiring substrate using the method according to claim 1; and
    (b) mounting a semiconductor chip on the wiring substrate.

* * * * *